(12) United States Patent
Kwon

(10) Patent No.: US 7,288,821 B2
(45) Date of Patent: Oct. 30, 2007

(54) STRUCTURE AND METHOD OF THREE DIMENSIONAL HYBRID ORIENTATION TECHNOLOGY

(75) Inventor: Oh-Jung Kwon, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/907,622

(22) Filed: Apr. 8, 2005

(65) Prior Publication Data
US 2006/0226495 A1  Oct. 12, 2006

(51) Int. Cl.
*H01L 29/72* (2006.01)

(52) U.S. Cl. .............. 257/371; 257/255; 257/347; 257/206; 257/278; 257/330; 257/369; 257/401; 257/622; 257/628

(58) Field of Classification Search ............ 257/255, 257/371, 622, 628
See application file for complete search history.

(56) References Cited

U.S. PATENT DOCUMENTS

| | | | |
|---|---|---|---|
| 4,156,879 A | 5/1979 | Lee | |
| 4,163,988 A | 8/1979 | Yeh et al. | |
| 4,193,182 A | 3/1980 | Lee | |
| 4,697,201 A | 9/1987 | Mihara | |
| 4,697,562 A | 10/1987 | Boccadoro et al. | |
| 4,733,399 A | 3/1988 | Mihashi et al. | |
| 4,734,887 A | 3/1988 | Sugatani | |
| 4,941,030 A | 7/1990 | Majumdar | |
| 5,003,359 A | 3/1991 | Abeles | |
| 5,049,971 A | 9/1991 | Krumm | |
| 5,120,666 A | 6/1992 | Gotou | |
| 5,324,981 A | 6/1994 | Kobiki et al. | |
| 5,808,340 A | 9/1998 | Wollesen et al. | |
| 5,874,317 A | 2/1999 | Stolmeijer | |
| 5,886,373 A | 3/1999 | Hosogi | |
| 5,960,271 A | 9/1999 | Wollesen et al. | |
| 6,521,921 B2 | 2/2003 | Lim et al. | |
| 6,624,451 B2 | 9/2003 | Ashley et al. | |
| 6,720,617 B2 | 4/2004 | Einav | |
| 2002/0000619 A1 | 1/2002 | Einav | |
| 2002/0008304 A1 | 1/2002 | Lim et al. | |
| 2002/0014633 A1 | 2/2002 | Ashley et al. | |

*Primary Examiner*—Edward Wojciechowicz
(74) *Attorney, Agent, or Firm*—Daniel H. Schnumann; Greenblum & Bernstein, P.L.C.

(57) ABSTRACT

A method and device for increasing pFET performance without degradation of nFET performance. The method includes forming a first structure on a substrate using a first plane and direction and forming a second structure on the substrate using a second plane and direction. In use, the device includes a nFET stack on a substrate using a first plane and direction, e.g., (100)<110> and a pFET stack on the substrate using a second plane and direction, e.g., (111)/<112>. An isolation region within the substrate is provided between the nFET stack and the pFET stack.

5 Claims, 16 Drawing Sheets

US 7,288,821 B2

STRUCTURE AND METHOD OF THREE DIMENSIONAL HYBRID ORIENTATION TECHNOLOGY

FIELD OF THE DESCRIPTION

The invention relates to semiconductor devices, and more particularly to semiconductor devices having increased pFET performance without degradation of the nFET performance and a method of manufacture.

BACKGROUND DESCRIPTION

Field effect transistors (FET's) are a fundamental building block in the field of integrated circuits. FET's can be classified into two basic structural types: horizontal and vertical. Horizontal, or lateral, FET's exhibit carrier flow from source to drain in a direction parallel (e.g., horizontal) to the plane of the substrate and vertical FET's exhibit carrier flow from source to drain in a direction transverse to the plane of the substrate (e.g., vertical) on which they are formed. FET structures may include a single gate (e.g., for forming a single channel) or a pair of gates (e.g., for forming a pair of channels), with double-gate versions providing an advantage of an increased current carrying capacity (e.g. typically greater than twofold over the single-gate versions).

A FET typically consists of source and drain electrodes interconnected by semiconductor material. Conduction between the drain and source electrodes occurs basically within the semiconductor, and the length between the source and drain is the conduction channel. In particular, the output current is inversely proportional to the channel length, while the operating frequency is inversely proportional to the square of the channel length.

The basic metal-oxide-semiconductor field-effect transistor (MOSFET) structure has a so-called "flat design". A nFET structure is a four-terminal device and consists of a p-type semiconductor substrate, into which two n-regions, a source electrode and drain electrode are formed (e.g., by ion implantation). The metal contact on the insulator is a gate. Heavily doped polysilicon or a combination of silicide and polysilicon can also be used as the gate electrode.

The basic device parameters are the channel length L, which is the distance between the two metallurgical n-p junctions, the channel width W, the gate oxide thickness t, the junction depth, and the substrate doping. When voltage is applied to the gate, the source-to-drain electrodes correspond to two p-n junctions connected back to back. The only current that can flow from source to drain is the reverse leakage current. When a sufficiently positive bias is applied to the gate so that a surface inversion layer (or channel) is formed between the two n-regions, the source and the drain are connected by the conducting surface of the n-channel through which a current can flow.

It is known, though, that the nFETs are optimized in the horizontal plane of the substrate. That is, the electron mobility across the channel is optimized when the nFET is fabricated on the 100 plane and the 110 direction. This is a typical flat structure fabrication. The pFET device, on the other hand, has significantly decreased performance characteristics when it is fabricated on the 100 plane and the 110 direction; namely, the hole mobility is significantly decreased, thereby degrading the performance of the entire device. However, it is typical in semiconductor fabrication to build both the nFET and pFET structures in the 100 plane and the 110 direction, using well-known processes.

SUMMARY OF THE INVENTION

In a first aspect of the invention, a method of fabricating a semiconductor structure comprising forming a first structure on a substrate using a first plane and direction and forming a second structure on the substrate using a second plane and direction.

In another aspect of the invention, a method of manufacturing a semiconductor device comprising building a nFET stack on a substrate using a first plane and direction and building a pFET stack on the substrate using a second plane and direction, different from the first plane and first direction. The method further includes providing an isolation region within the substrate between the nFET stack and the pFET stack.

In another aspect of the invention, a semiconductor structure includes a nFET stack on a substrate using a first plane and direction and a pFET stack on the substrate using a second plane and direction, different from the first plane and first direction. An isolation region within the substrate is provided between the nFET stack and the pFET

DETAILED DESCRIPTION OF EMBODIMENTS OF THE INVENTION

The invention is directed to semiconductor structures and more particularly to semiconductor structures and methods of manufacture using three dimensional hybrid orientation technologies. In one aspect of the invention, the performance of a pFET is improved or optimized by increasing carrier mobility for the pFET without any degradation in the performance of the nFET. To accomplish the invention, the nFET is formed in a first plane/direction and the pFET is formed in a second plane/direction using similar processing steps. For example, in one non-limiting aspect of the invention, the nFET will be formed in the (100)/<110> plane/direction and the pFET will be formed in the (111)/<112> plane/direction. In this manner, the channel length of the pFET may be longer than the channel length of nFET using the same processes. The invention is compatible with CMOS technologies such as, for example, SOI, strained Si, dual spacer and the like.

Figure 1:
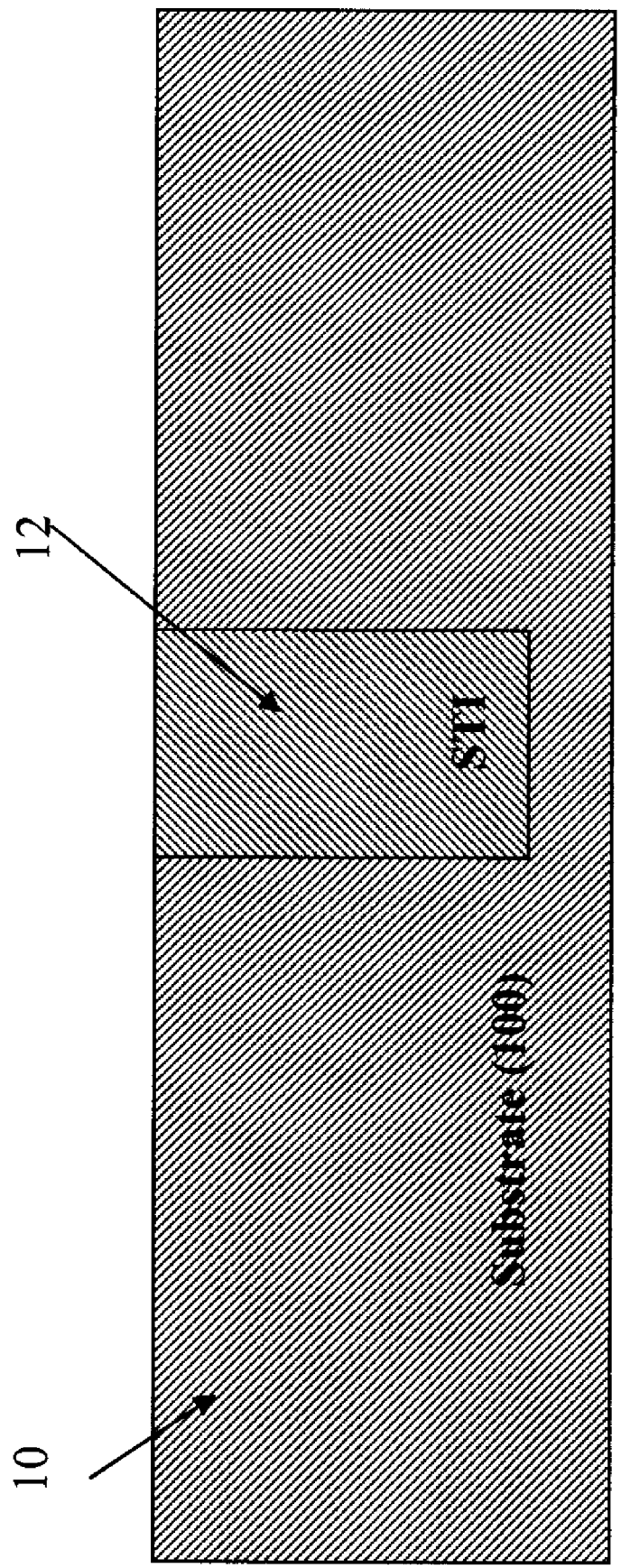
FIGS. 1-15 illustrates steps in manufacturing a device in accordance with the invention.

FIG. 1 shows a beginning structure in accordance with the invention. In this structure, a shallow trench isolation structure (STI) 12 is formed in a substrate 10 having a (100) plane. In one exemplary illustration, the depth of the STI 12 is between 2000 Å-5000 Å, depending on the required device performance. The depth of the STI 12 may be shallower in SOI process technologies. In the embodiment described herein, a nFET will be formed on one side of the STI 12 and a pFET will be formed on an opposing side of the STI 12.

By an exemplary illustration, the STI 12 may be formed by depositing a pad oxide and pad nitride over the substrate 10. A photo mask or a hard mask is formed over the pad nitride and an etching process etches to the substrate through the formed layers. An additional etching process etches into the substrate to form the trench. An oxide, for example, is deposited in the trench to fill the trench. The surface is planarized using a chemical mechanical polishing (CMP) process. The pad nitride may then be removed, resulting in the structure of FIG. 1.

Figure 2:
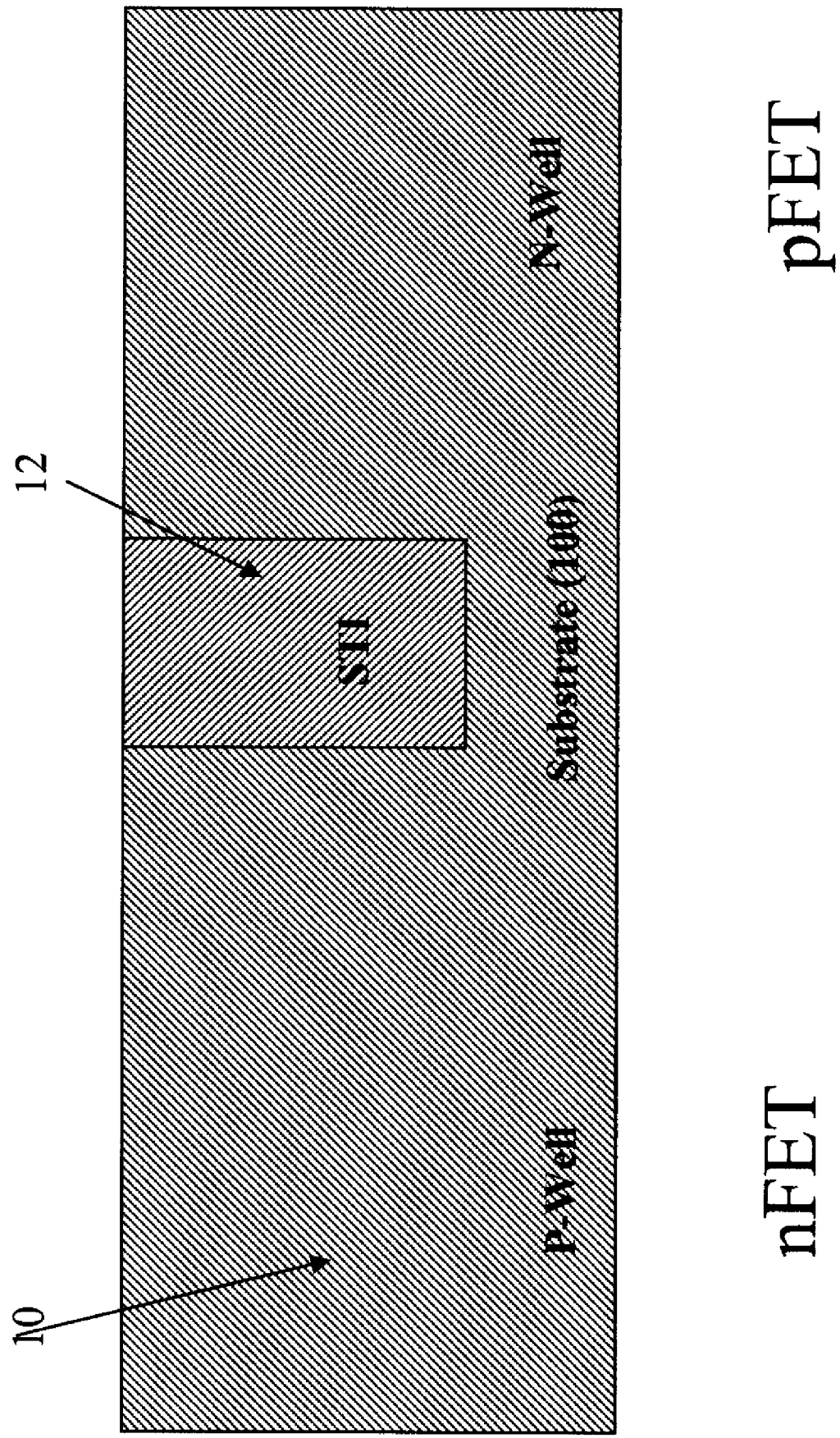

FIG. 2 represents a well implantation process. In one implementation, the p-well is doped using boron, which later forms part of the nFET. The n-well may be doped with phosphorous, which later forms part of the pFET. The doping is performed using well-known processes in the industry.

Figure 3:
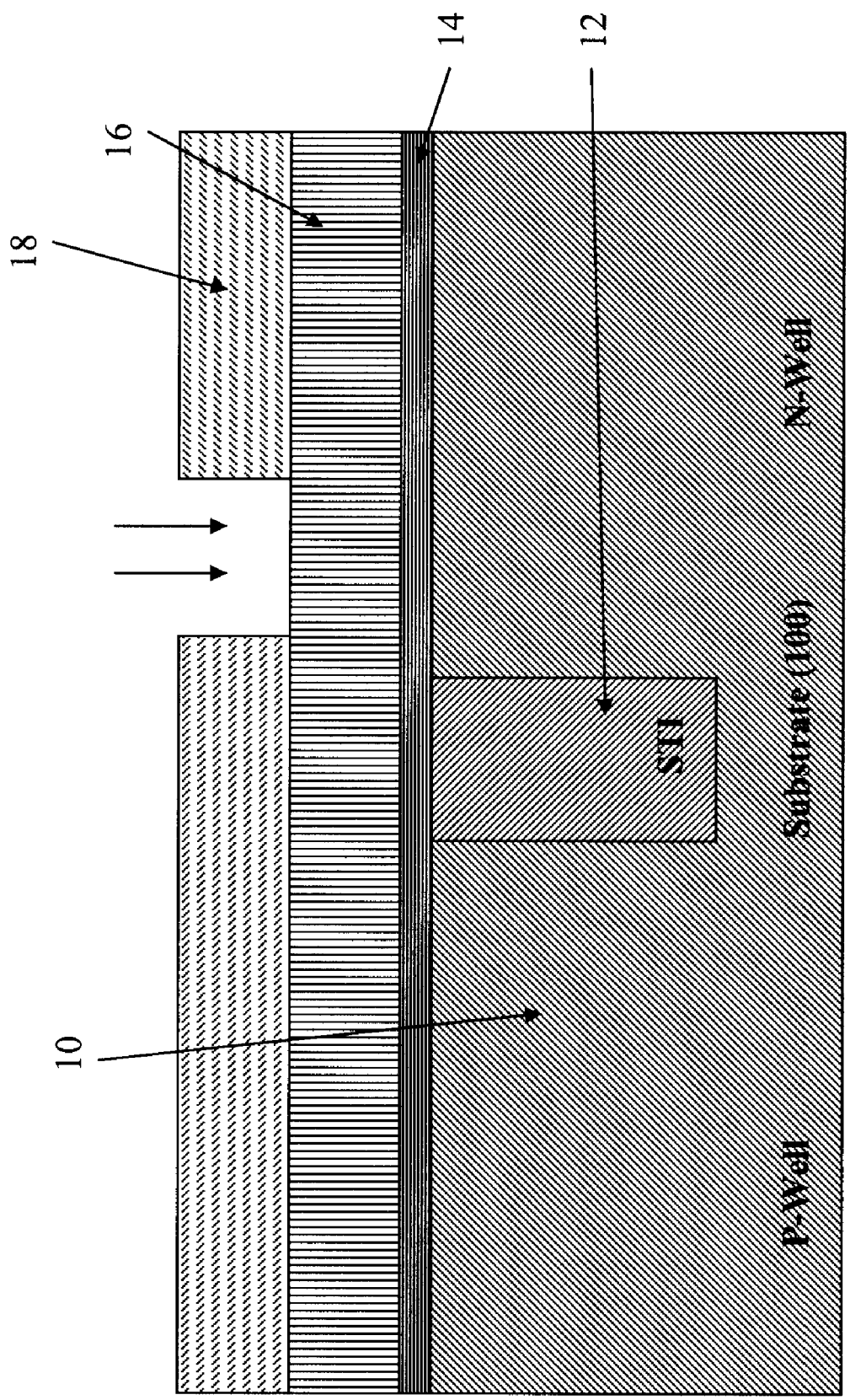

In FIG. 3, an oxide material 14 is formed over the substrate 10 using well-known processes such as, for example, thermal oxidation or chemical vapor deposition. In one aspect of the invention, the oxide layer 14 is approximately 10 Å to 10 Å in thickness; although other thickness or dimensions are contemplated by the invention. A block material 16 such as nitride is deposited over the oxide layer 14 using a CVD process, for example. The block material 16 may be in the range of 200 Å to 2000 Å, although other thickness and dimensions are also contemplated for use with the invention. A photoresist 18 is deposited over the block material 16. After patterning, only pFET region is opened for subsequent anisotropic etching.

Figure 4:
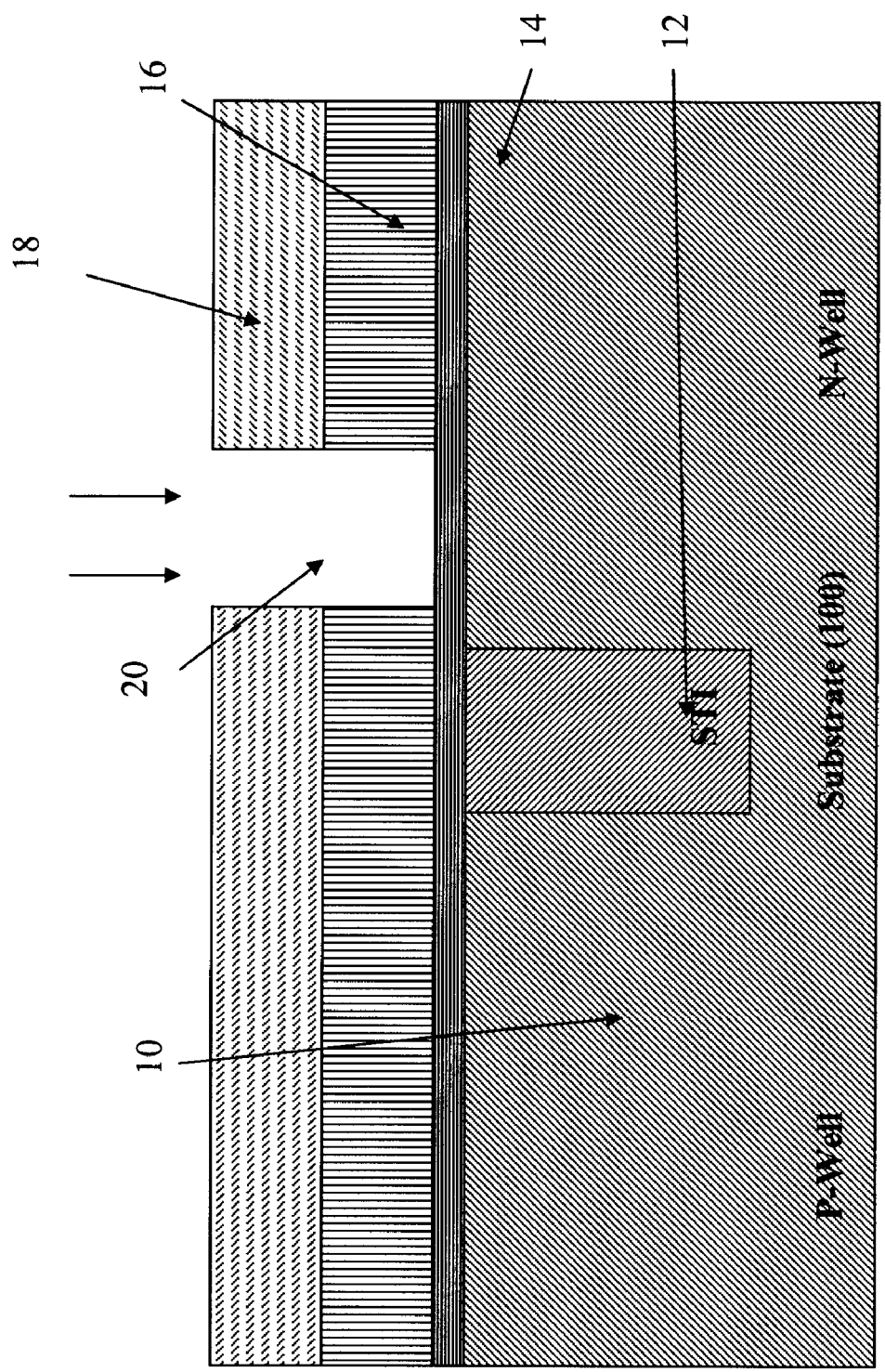

FIG. 4 is representative of a selective anisotropic etch of the block material 16. In this process, the etching is selective to the nitride block layer 16, and the oxide layer 14 acts as a etch stop layer. In this process, an etched area 20 is formed in the block material 16.

Figure 5:
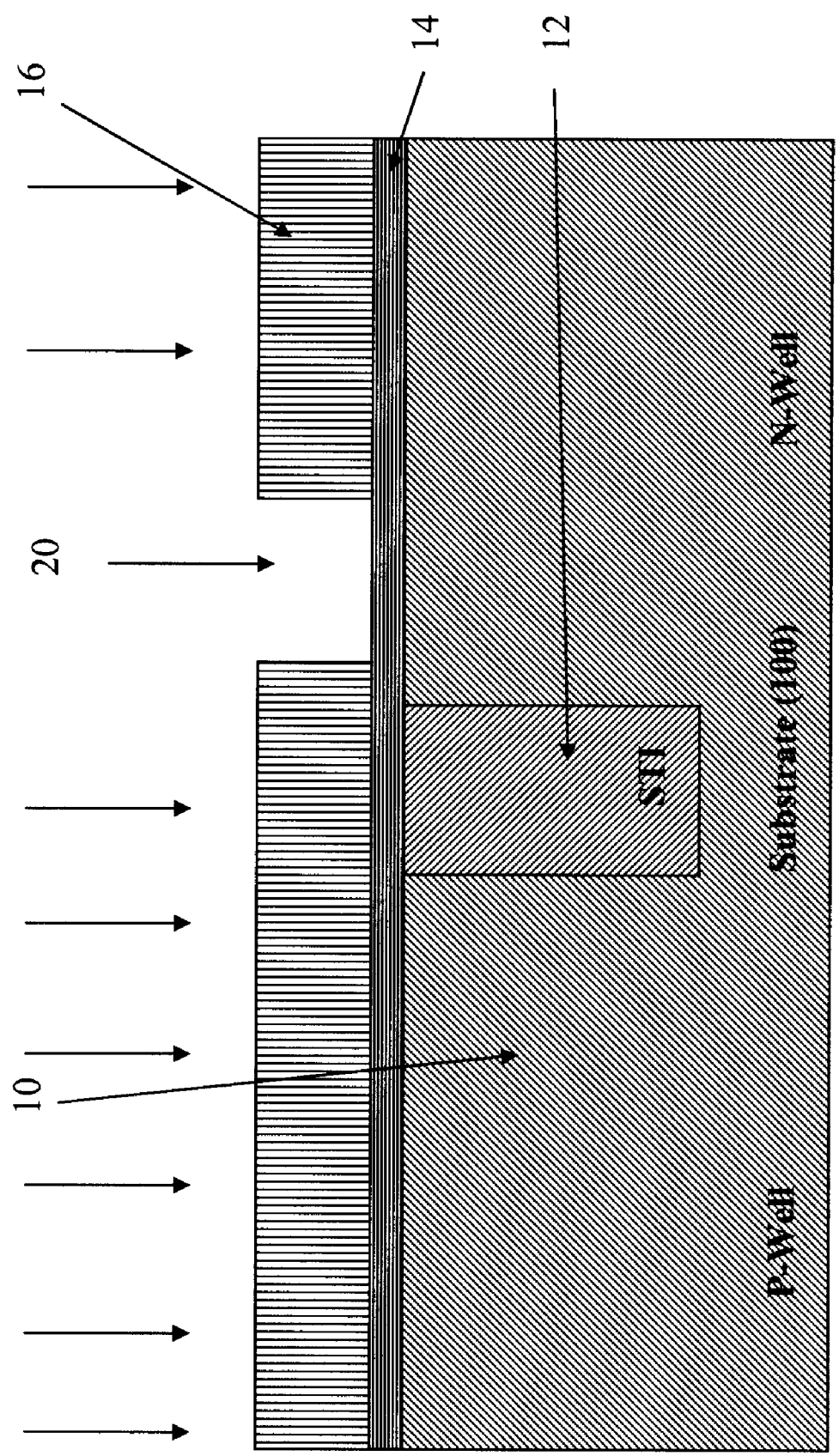
Figure 6:
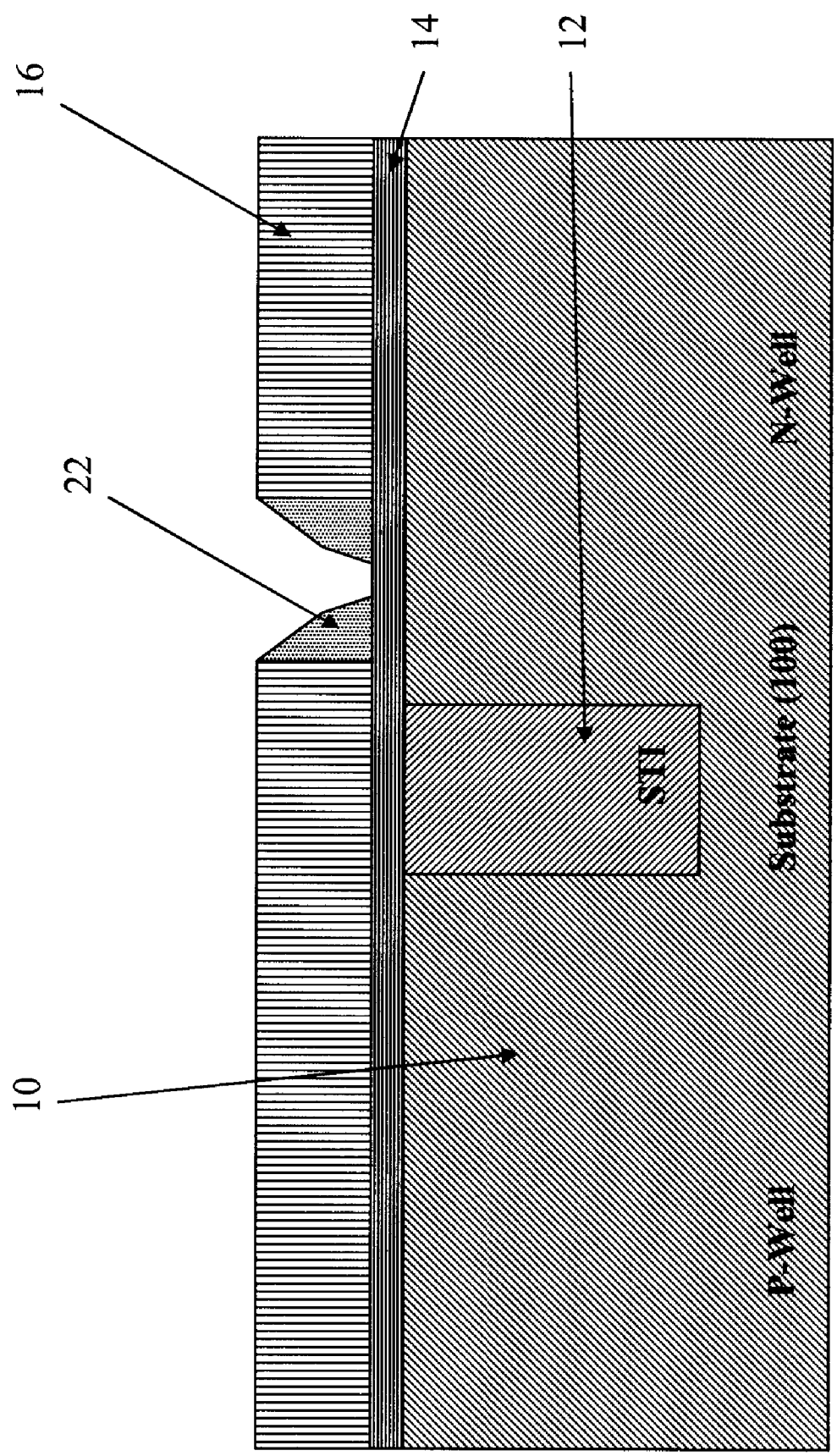

The photoresist layer 18 is then stripped using a dry stripping process, for example (FIG. 5). In FIG. 6, a spacer nitride deposition and etching process is performed. In this process, spacers 22 are formed in the etched area 20 to reduce the spacing and smooth the active area of the to be formed pFET. Forming spacer nitride may be skipped if the etched area 20 is controllable by litho process in FIG. 3.

Figure 7:
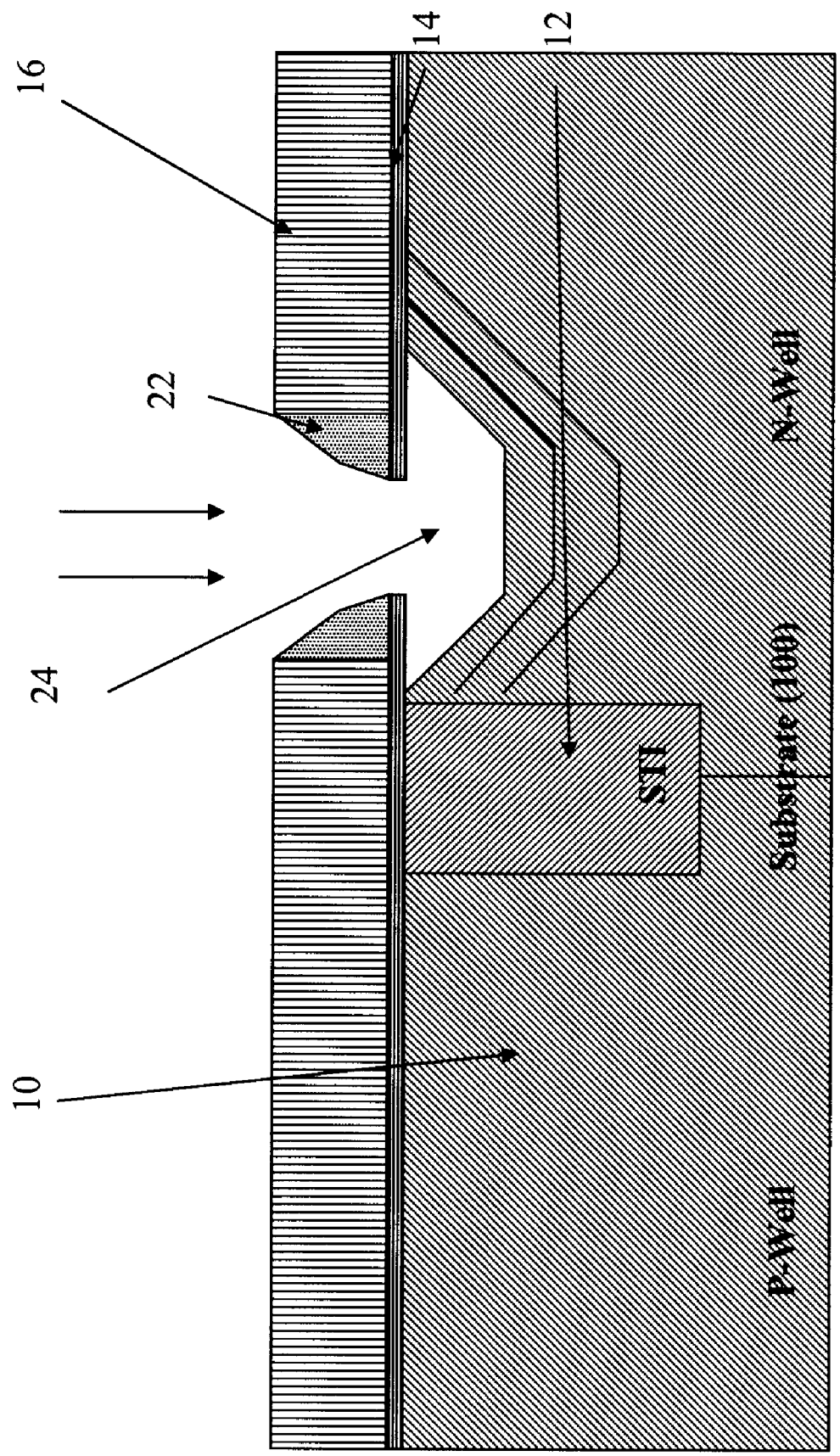

Referring to FIG. 7, the oxide layer 14 is then removed in the etched area 20 using, for example, a wet etch process. This wet etch process may utilize, for example, diluted HF. A preferential etching process is then performed in the substrate using for example a KOH, or ammonia. This etching step is an anisotropic etching which, in non-limiting embodiments, etches to a depth of 200 Å to 900 Å, although other etching depths and dimensions are contemplated by the invention depending on the device requirements. In one aspect of the invention, the etched area, which forms a trench 24, will have a smooth transition with the STI 12; however, it is contemplated by the invention that a stepped portion can be present between the STI 12 and the etched trench 24.

Figure 8:
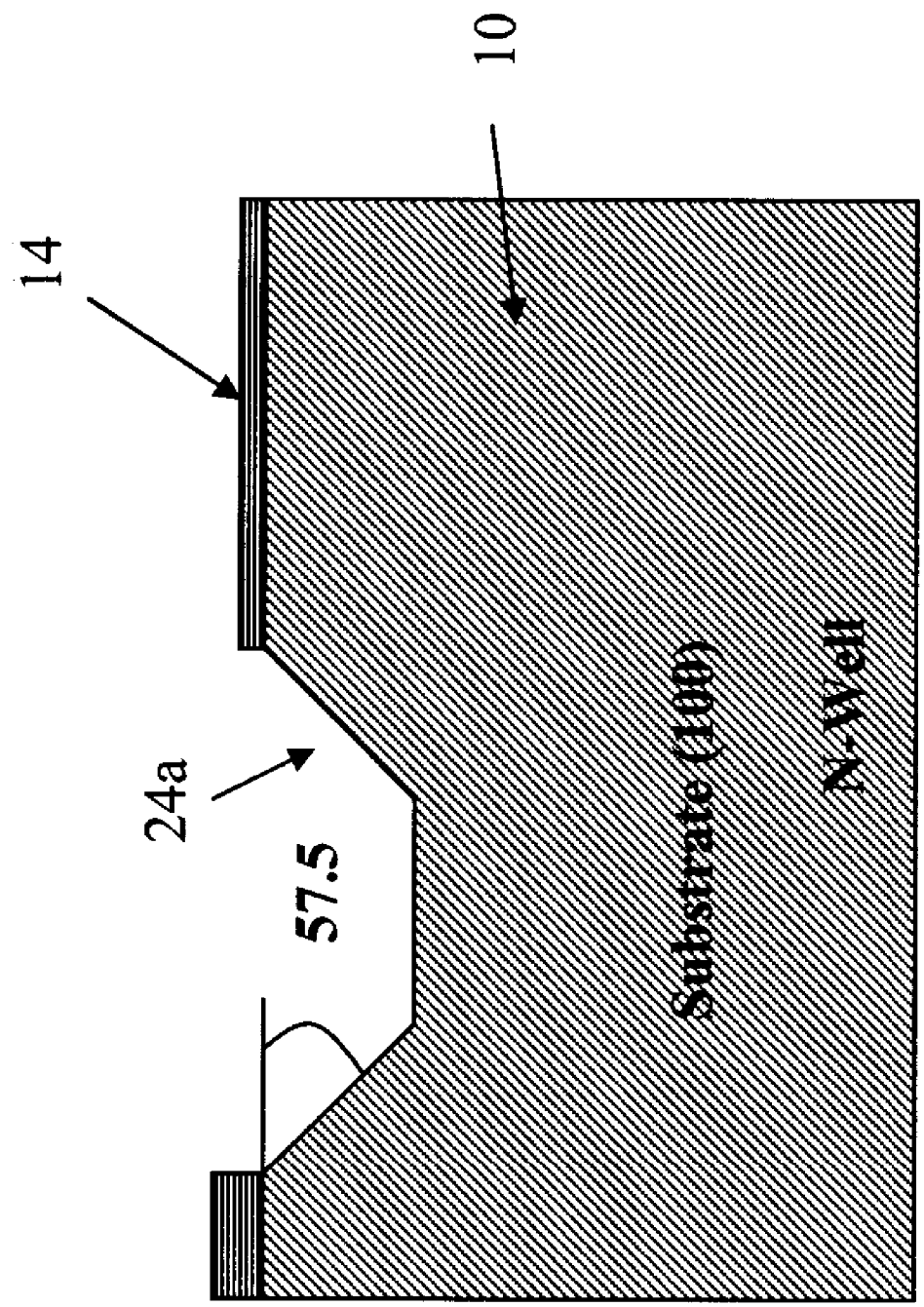

FIG. 8 represents one embodiment of the etch geometry as discussed with reference to FIG. 7. In this non-limiting embodiment, an anisotropic wet etch is used to etch in the substrate 100, forming a sidewall 24a having an angle of approximately 57.5° with respect to the plane (100) of the substrate 10.

Figure 9:
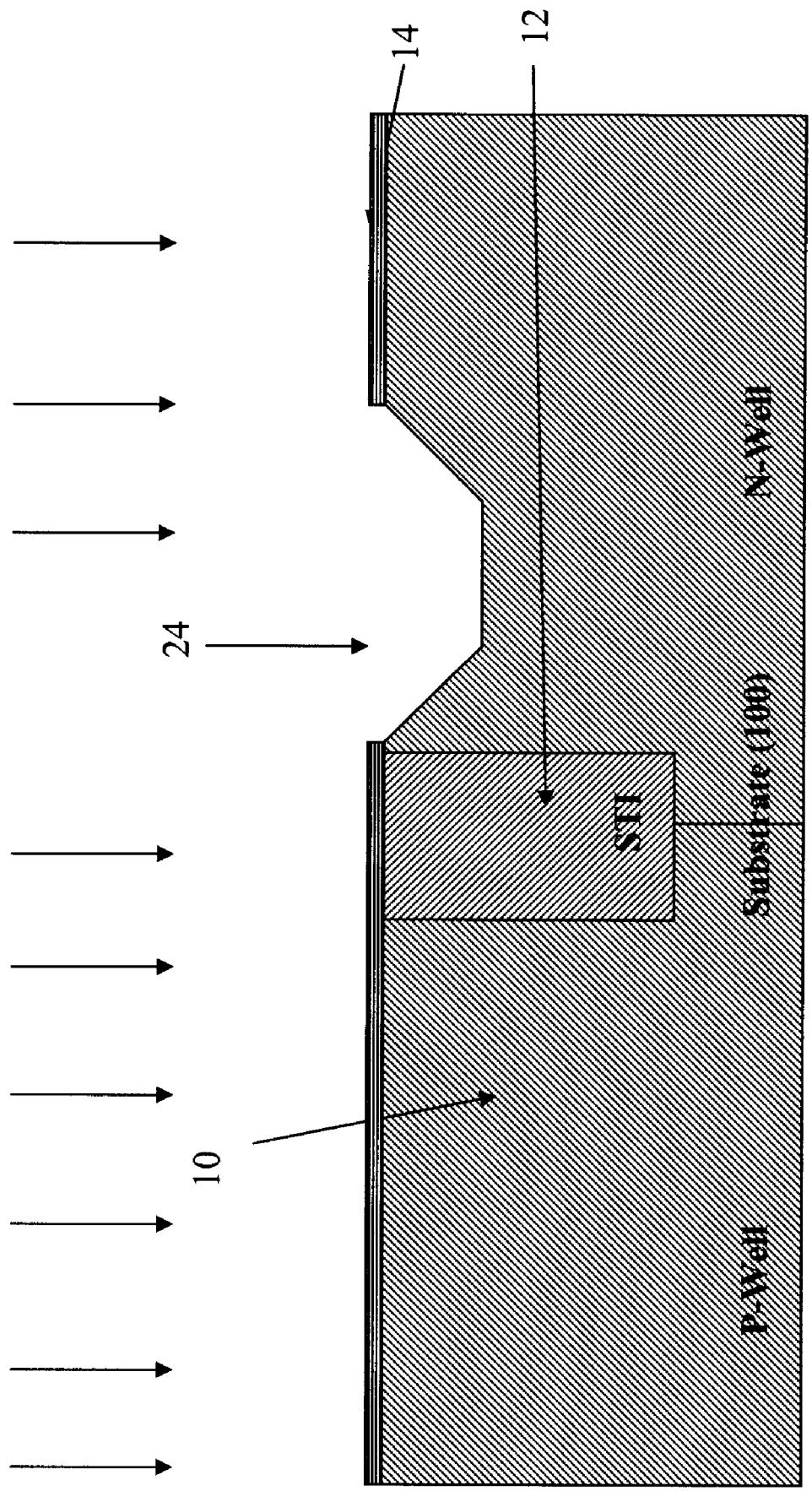

In FIG. 9, the nitride block material 16 is removed using well-known hot phosphoric acid etching. It is well-known that hot phosphoric acid etches only nitride without loss of oxide and silicon. The oxide layer 14 may be removed.

Figure 10:
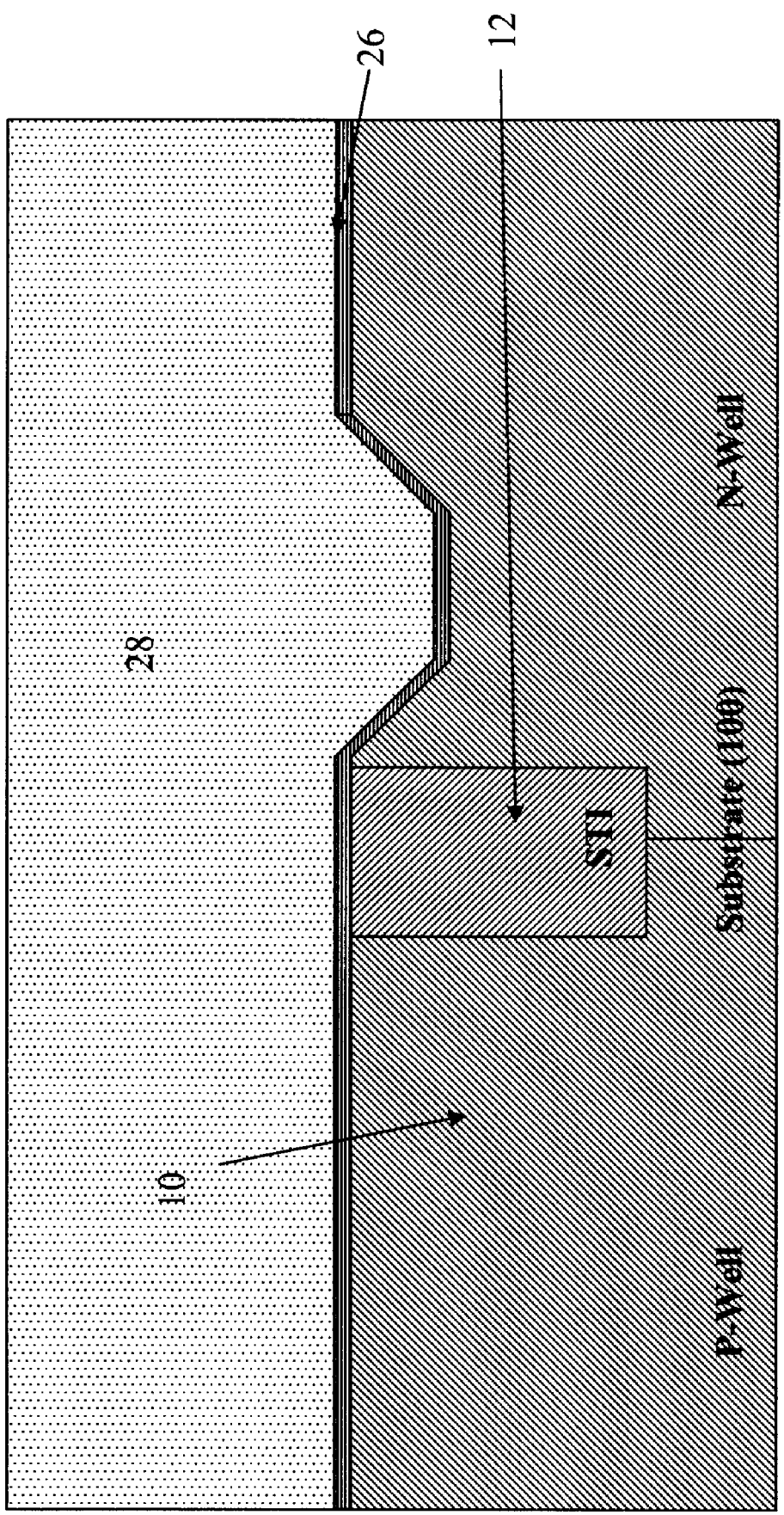

Referring to FIG. 10, after the etching of the nitride block and the oxide layer, a gate dielectric 26 is formed on the surface of the substrate 10, including in the trench 24. The gate dielectric 26 may be an oxide, oxynitride or high-K material, for example. In one example, the gate dielectric 26 may be approximately 10 Å to 100 Å. A poly 28 is deposited over the gate dielectric 26. In case of high-K material, metallic electrode can be deposited over the high-K material.

Figure 11:
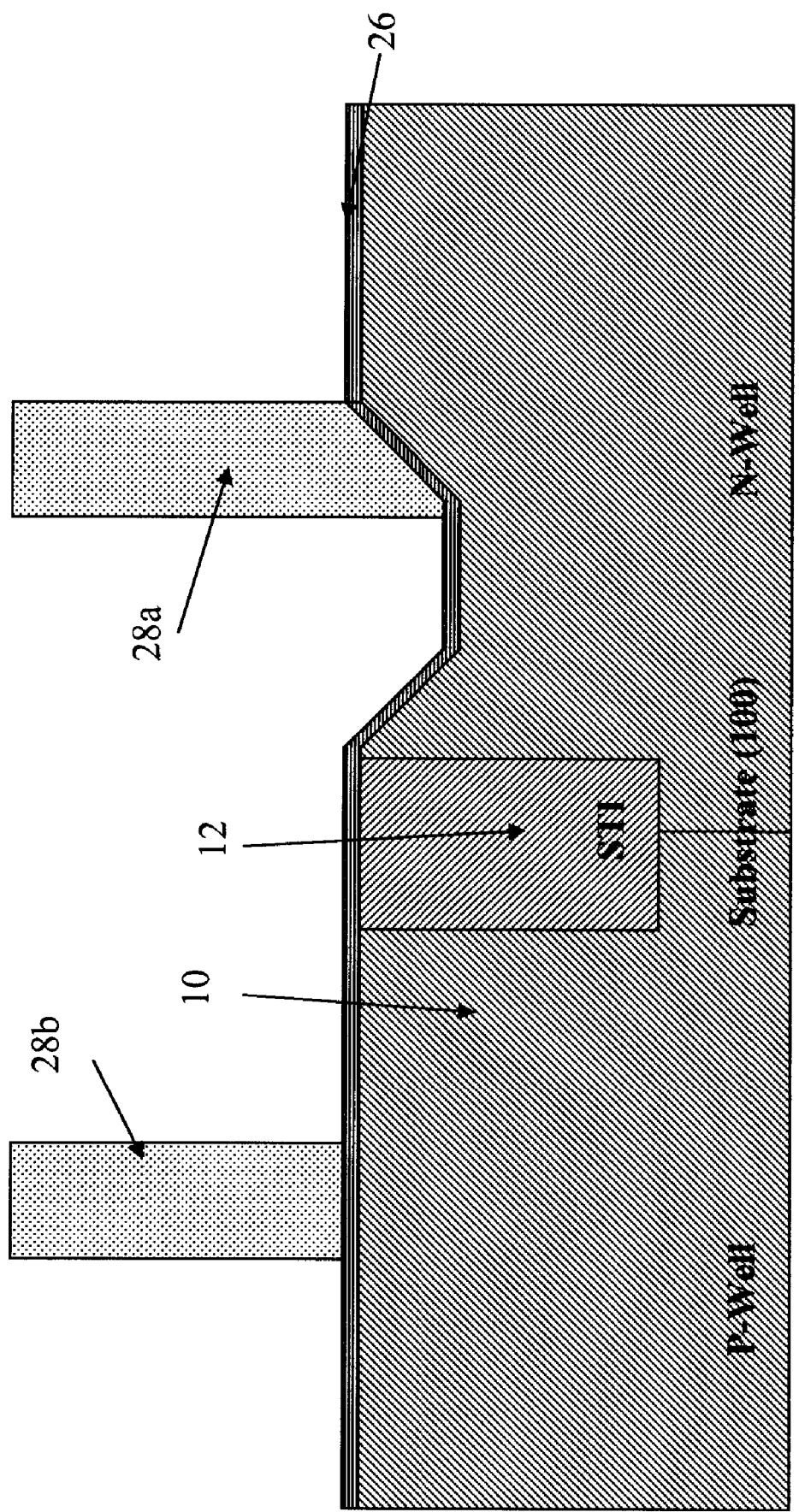

FIG. 11 shows the formation of the beginning structures (e.g., stacks) of the nFET and the pFET. In this process, the poly 28 is etched in well-known processes such as lithography and poly RIE. The STI 12 may be used as a basis for alignment of the pFET stack as should be understood to those of ordinary skill in the art, i.e., to ensure that the formation of the pFET stack is formed on the angled sidewall 24a. In this manner, the pFET stack 28a will be formed in the (111) plane and a <112> direction; whereas, the nFET 28b stack will be formed in the (100) plane and <110> direction, simultaneously.

Figure 12:
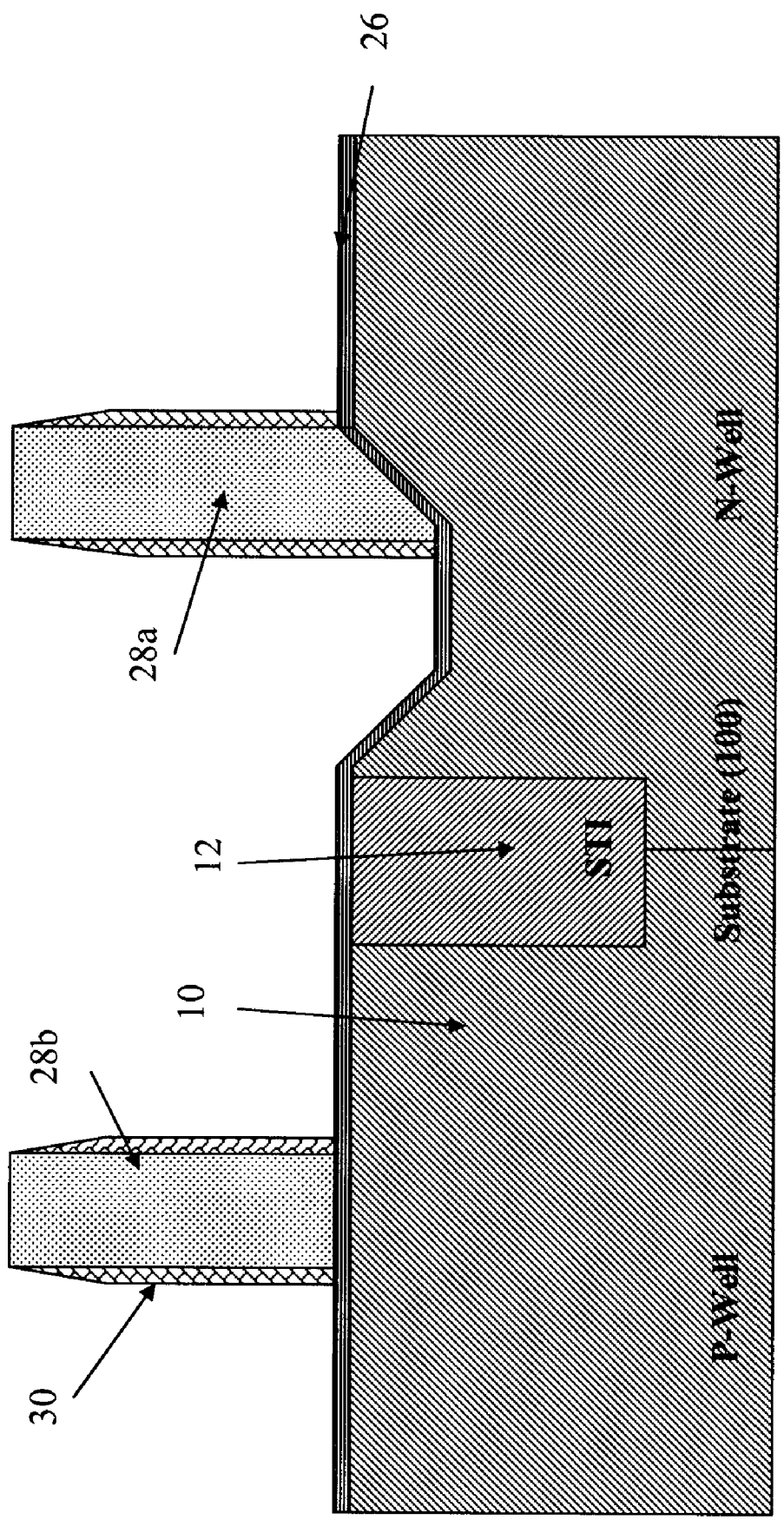
Figure 13:
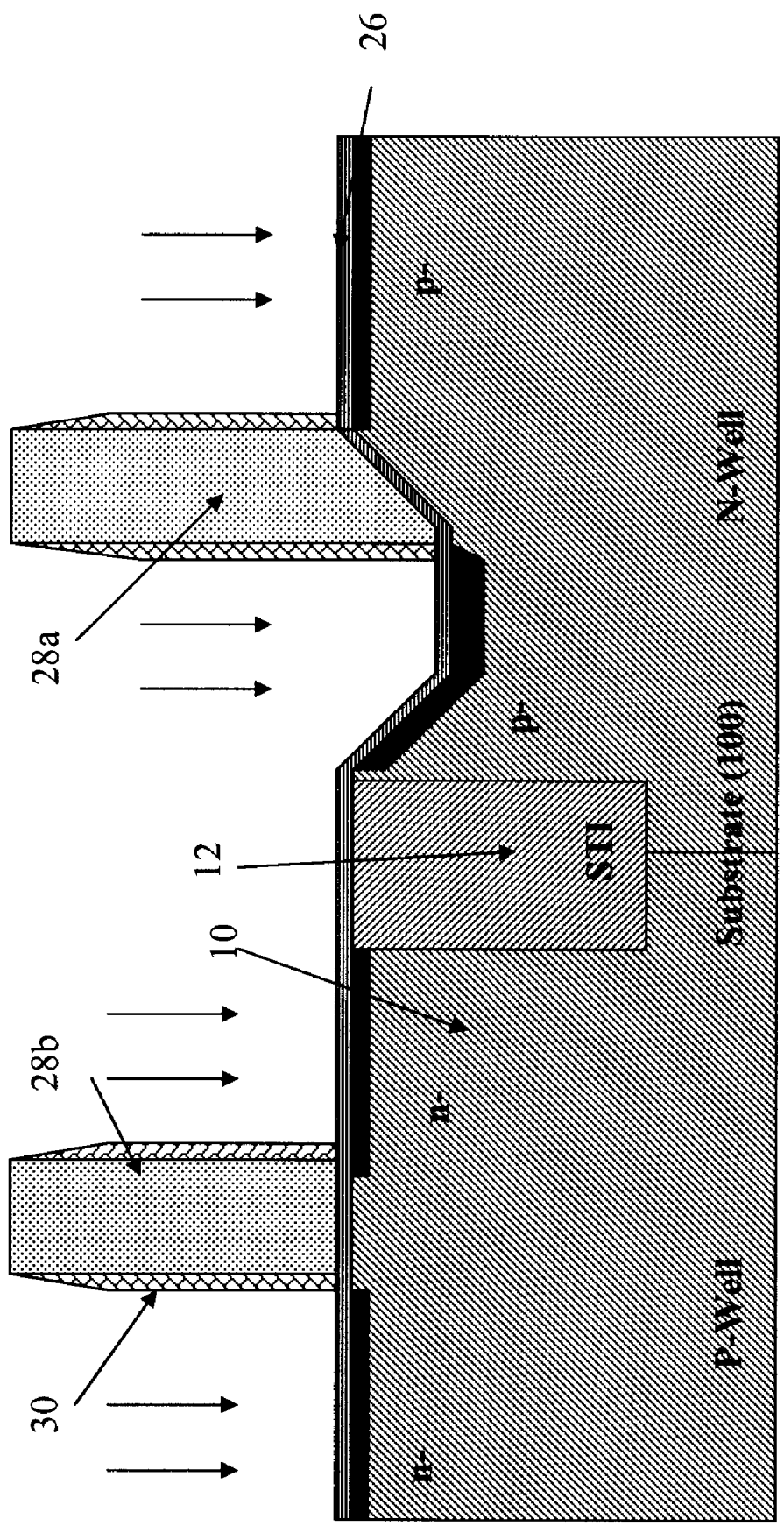

FIG. 12 shows a spacer 30 formation. Depending on the particular requirements, the spacers 30 may be a nitride or an oxide. The spacers 30 are formed in processes well-known in the art to those of skill such that further discussion is not required herein for a complete understanding of the invention. Extension implantation is performed, as representative of the steps of FIG. 13. In this process, phosphorous or arsenic may be implanted for the nFET and boron may be implanted for the pFET.

Figure 14:
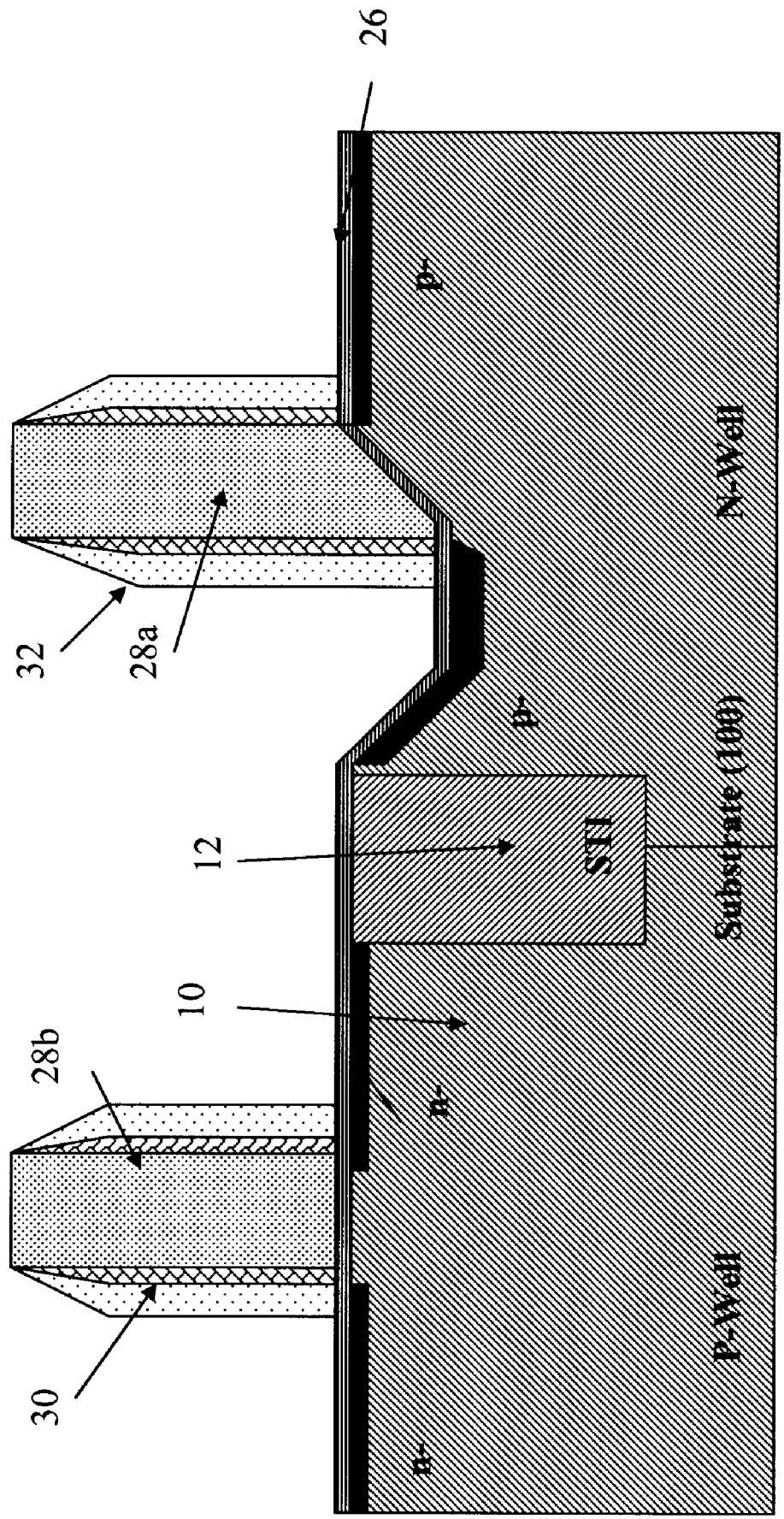
Figure 15:
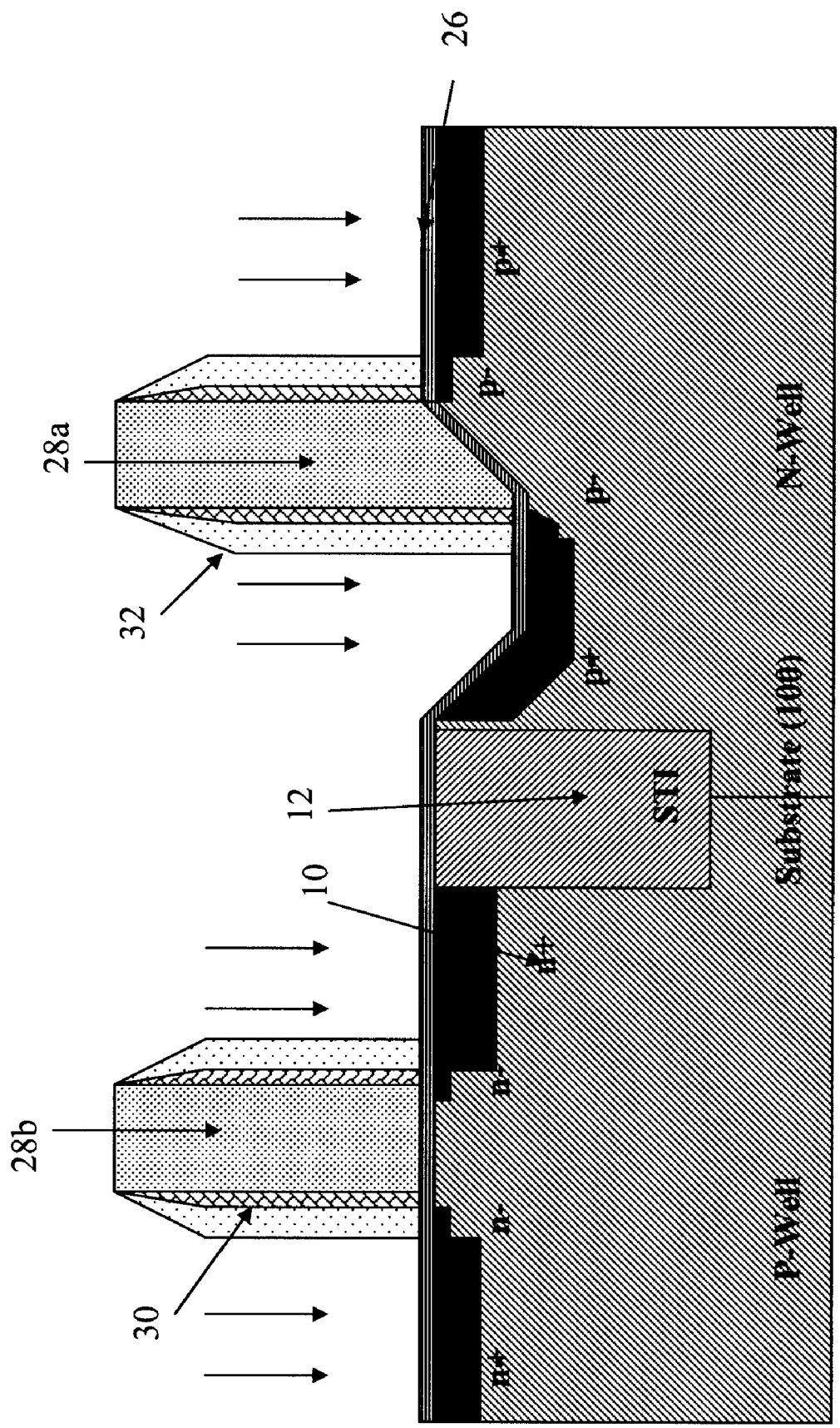

FIG. 14 is representative of a spacer 32 formation on the sides of the stacks 28a and 28b of the pFET and nFET, respectively. It is also contemplated that different material can be used as 28a and 28b respectively for improving device performance. Some nitride with tensile stress for nFET and other nitride with compressive stress for pFET will be one of the examples. In one non-limiting aspect of the invention, the spacers 32 are formed of nitride using processes well-known in the art to those of skill such that further discussion is not required for a complete understanding of the invention. FIG. 15 represents the source/drain formation for both the nFET and pFET. Again, the processes for forming the source/drain regions are well known in the art to those of skill such that further discussion is not required for a complete understanding of the invention.

Figure 16:
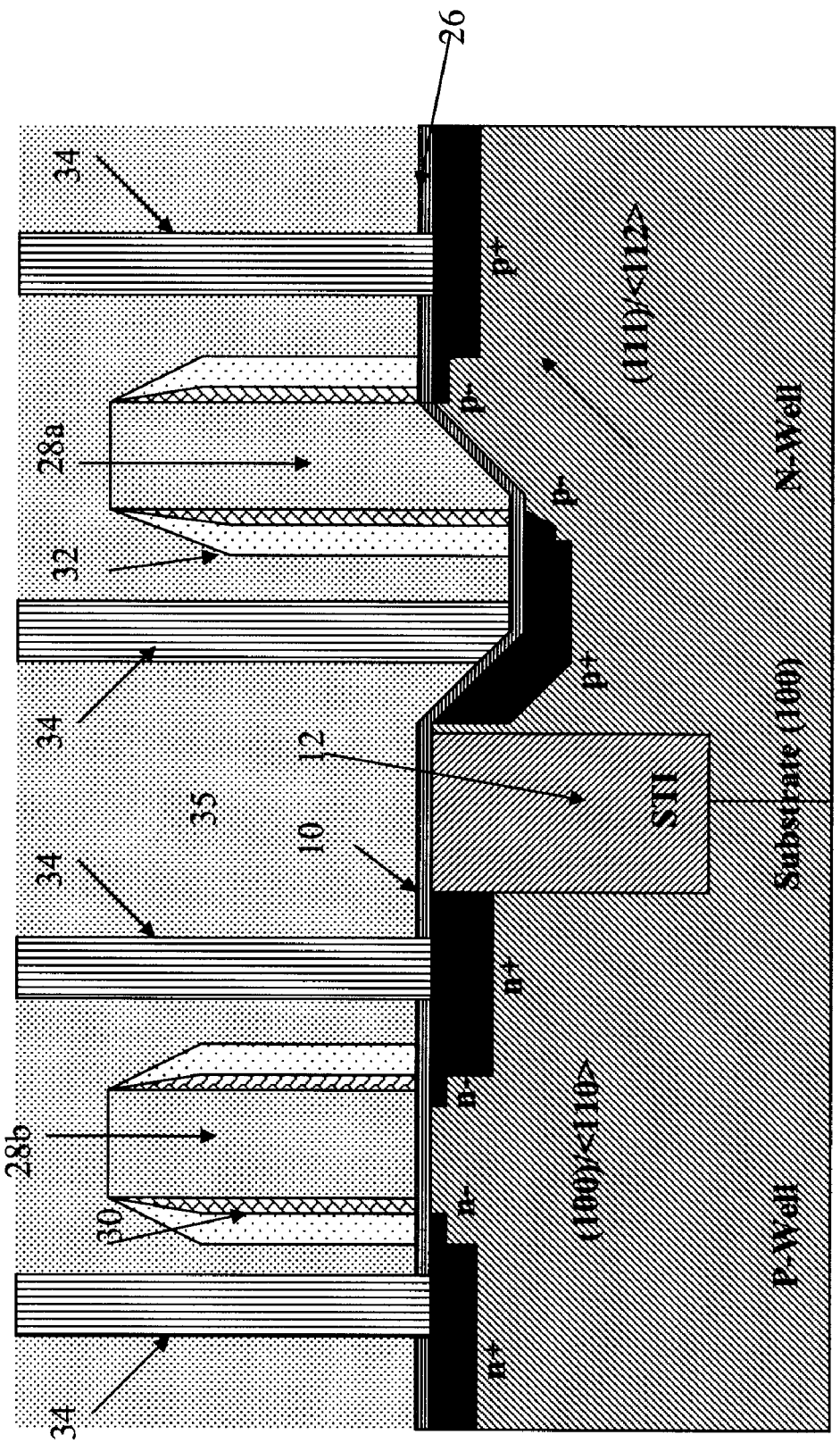
FIG. 16 illustrates a final structure and manufacturing in accordance with the invention.

FIG. 16 illustrates the final structure of the device in accordance with the invention. In FIG. 16, metal contacts 34 are formed to the source drain/regions of the nFET and pFET. In one exemplary process, a RIE process is used to etch the inter layer dielectric 35 and the gate dielectric. A metal is then deposited to fill the contact hole such as, for example, tungsten. TiN may be used to form the barrier material between source/drain and metal contact prior to tungsten deposition, as one illustrative example. As represented in FIG. 16, the resultant pFET stack is formed in the (111) plane and carrier transport direction is the <112> direction as a result of the etching step formed in FIG. 6, in addition to the remaining stack formation steps. Also, the nFET stack is formed in the (100) plane and carrier transport direction is <110> direction.

It has been found that the hole mobility for a pFET in the (111) plane and <112> direction is superior than in the (100) plane and <110> direction, but worse than in the (110) plane and <110> direction; whereas, the electron mobility for a nFET in the (111) plane and <112> direction is worse than in the (100) plane and <110> direction, but superior than in the (110) plane and <110> direction. To thus optimize the pFET performance without degrading the nFET performances, in the present invention, the pFET is formed in the (111) plane and the <112> direction and the nFET is optimized in the (100) plane and the <110> direction.

While the invention has been described in terms of exemplary embodiments, those skilled in the art will recognize that the invention can be practiced with modifications and in the spirit and scope of the appended claims.

What is claimed is:

1. A structure, comprising:
   a nFET stack on a substrate using a first plane and direction;
   a pFET stack on the substrate using a second plane and direction, different from the first plane and first direction; and
   an isolation region within the substrate between the nFET stack and the pFET stack,
   wherein the pFET stack is formed on an angled surface of a trench formed in the substrate.

2. The structure of claim 1, wherein the angled surface of the trench is at a different plane and direction than a surface on which the nFET stack is formed.

3. The structure of claim 1, wherein the angled surface of the trench is approximately 57.5 degrees relative to a plane (100) of the substrate.

4. The structure of claim 1, wherein the angled surface of the trench results in the second plane and direction of (111)/<112>.

5. A structure, comprising:
   a nFET stack on a substrate using a first plane and direction of the substrate;
   a pFET stack formed at least partially on an angled surface of a trench in the substrate, wherein the angle surface is a second plane and direction of the substrate, different from the first plane and first direction; and
   an isolation region within the substrate between the nFET stack and the pFET stack.

* * * * *